United States Patent
Kim

(10) Patent No.: US 11,588,156 B2
(45) Date of Patent: Feb. 21, 2023

(54) COPPER FOIL HAVING EXCELLENT ADHESIVE STRENGTH, ELECTRODE COMPRISING SAME, SECONDARY BATTERY COMPRISING SAME, AND MANUFACTURING METHOD THEREFOR

(71) Applicant: KCF Technologies Co., Ltd., Anyang-si (KR)

(72) Inventor: Seung Min Kim, Anyang-si (KR)

(73) Assignee: SK NEXILIS CO., LTD., Jeongeup-si (KR)

( * ) Notice: Subject to any disclaimer, the term of this patent is extended or adjusted under 35 U.S.C. 154(b) by 296 days.

(21) Appl. No.: 16/489,021

(22) PCT Filed: Feb. 26, 2018

(86) PCT No.: PCT/KR2018/002311
§ 371 (c)(1),
(2) Date: Aug. 27, 2019

(87) PCT Pub. No.: WO2018/155972
PCT Pub. Date: Aug. 30, 2018

(65) Prior Publication Data
US 2020/0006777 A1   Jan. 2, 2020

(30) Foreign Application Priority Data

Feb. 27, 2017  (KR) .................... 10-2017-0025581

(51) Int. Cl.
*H01M 4/00* (2006.01)
*H01M 4/66* (2006.01)
(Continued)

(52) U.S. Cl.
CPC .............. *H01M 4/667* (2013.01); *C25D 1/04* (2013.01); *H01M 4/661* (2013.01);
(Continued)

(58) Field of Classification Search
CPC ................ H01M 4/667; H01M 4/661; H01M 2004/027; H01M 4/13; H01M 10/052;
(Continued)

(56) References Cited

U.S. PATENT DOCUMENTS

2007/0287020 A1   12/2007  Saito et al.
2009/0061326 A1*   3/2009  Hirose ................. H01M 4/366
                                                    429/338
(Continued)

FOREIGN PATENT DOCUMENTS

| CN | 1464838 A | 12/2003 |
|---|---|---|
| CN | 102884660 A | 1/2013 |

(Continued)

OTHER PUBLICATIONS

Japanese Office Action for related Japanese Application No. 2019-546314; action dated Sep. 24, 2020; (4 pages).
(Continued)

*Primary Examiner* — Nicholas P D'Aniello
(74) *Attorney, Agent, or Firm* — K&L Gates LLP

(57) ABSTRACT

An embodiment of the present invention provides a copper foil which comprises a copper layer and an anticorrosive film placed on the copper layer, and has a Young's modulus of 3800 to 4600 kgf/mm$^2$ and a modulus bias factor (MBF) less than 0.12, wherein the modulus bias factor (MBF) is obtained by formula 1 below.

MBF=(maximum Young's modulus−minimum Young's modulus)/(average Young's modulus)  [Formula 1]

13 Claims, 4 Drawing Sheets

(51) Int. Cl.
*C25D 1/04* (2006.01)
*H05K 1/09* (2006.01)
*H05K 3/02* (2006.01)
*H01M 50/534* (2021.01)
*H01M 4/02* (2006.01)

(52) U.S. Cl.
CPC ............ *H01M 50/534* (2021.01); *H05K 1/09* (2013.01); *H05K 3/022* (2013.01); *H01M 2004/027* (2013.01); *H05K 2203/0723* (2013.01); *H05K 2203/0779* (2013.01)

(58) Field of Classification Search
CPC ......... H01M 50/534; C25D 1/04; C25D 1/20; H05K 1/09; H05K 3/022; H05K 2203/0723; H05K 2203/0779; Y02E 60/10
See application file for complete search history.

(56) References Cited

U.S. PATENT DOCUMENTS

| | | | |
|---|---|---|---|
| 2010/0136434 A1* | 6/2010 | Hanafusa | C22F 1/00 |
| | | | 429/245 |
| 2016/0197351 A1 | 7/2016 | Tani et al. | |
| 2018/0102544 A1* | 4/2018 | Kim | H01M 4/661 |

FOREIGN PATENT DOCUMENTS

| | | |
|---|---|---|
| JP | 07202367 | 8/1995 |
| JP | H07202367 A | 8/1995 |
| JP | 2002363786 A | 12/2002 |
| JP | 2009256772 A | 11/2009 |
| JP | 2012001786 A | 1/2012 |
| JP | 2014111827 A | 6/2014 |
| JP | WO2013002279 A1 | 2/2015 |
| KR | 940007609 B1 | 8/1994 |
| KR | 101423762 B1 | 7/2014 |
| KR | 20150114484 A | 10/2015 |
| KR | 20160097020 A | 8/2016 |
| TW | 201448338 A | 12/2014 |
| WO | 2016208858 A1 | 12/2016 |

OTHER PUBLICATIONS

International Search Report and Written Opinion for related International Application No. PCT/KR2018/002311 report dated Nov. 8, 2018 and dated Nov. 7, 2018; (9 pages).
European Search Repod for related European Application No. 18757189.8; action dated Nov. 13, 2020; (11 pages).
Zhang, et al; "Mechanical Properties of Copper Thin Films Used in Electronic Devices"; 2011; Procedia Engineering; vol. 10; (6 pages).
Chinese Office Action for related Chinese Application No. 201880024525.5; action dated Jan. 26, 2022; (7 pages).

* cited by examiner

COPPER FOIL HAVING EXCELLENT ADHESIVE STRENGTH, ELECTRODE COMPRISING SAME, SECONDARY BATTERY COMPRISING SAME, AND MANUFACTURING METHOD THEREFOR

CROSS-REFERENCE TO RELATED APPLICATIONS

The present application is a National Stage of International Application No. PCT/KR2018/002311, filed Feb. 26, 2018, which claims priority to Korean Application No. 10-2017-0025581 filed on Feb. 27, 2017, the disclosure of which are incorporated herein by reference.

TECHNICAL FIELD

The present disclosure relates to a copper foil having excellent adhesive force, an electrode including the same, a secondary battery including the same, and a method of manufacturing the same.

BACKGROUND ART

A copper foil is used to manufacture various products, such as a cathode of a secondary battery and a flexible printed circuit board (FPCB).

An electrolytic copper foil is a copper foil formed by electroplating. The electrolytic copper foil is manufactured through a roll-to-roll (RTR) process. In addition, the copper foil is used to manufacture a cathode of a secondary battery, a flexible printed circuit board (FPCB), etc. through the roll-to-roll (RTR) process.

In recent years, an anode active material including silicon (Si) has been used in order to increase the capacity of a secondary battery. Since the anode active material has a high volumetric expansion rate at the time of charging and discharging the secondary battery, the anode active material is easily separated from the copper foil, which serves as a current collector of an anode, compared to a conventional carbon-based active material. As a result, the lifespan of the battery is reduced. In order to solve this problem, it is necessary to increase the force of adhesion or tight contact between the copper foil and the active material.

A method of increasing the surface roughness of the copper foil is used in order to increase the force of adhesion or tight contact between the copper foil and the anode active material. Even though the surface roughness of the copper foil is increased, however, there is a limitation in the extent to which the force of adhesion or tight contact between the copper foil and the anode active material can be increased.

DISCLOSURE

Technical Problem

Therefore, the present disclosure relates to a copper foil that is capable of solving the above problems, an electrode including the same, a secondary battery including the same, and a method of manufacturing the same.

An embodiment of the present disclosure provides a copper foil having excellent adhesive force.

Another embodiment of the present disclosure provides an electrode for secondary batteries, wherein the electrode includes the copper foil and is configured such that separation between the copper foil and an active material is prevented, and a secondary battery including the electrode for secondary batteries, wherein the secondary battery has high efficiency and an excellent capacity retention rate.

Another embodiment of the present disclosure provides a flexible copper clad laminate (FCCL) including the copper foil.

Another embodiment of the present disclosure provides a method of manufacturing the copper foil having excellent adhesive force.

In addition to the viewpoints mentioned above, other features and advantages of the present disclosure will be described hereinafter, or will be clearly understood by those skilled in the art to which the present disclosure pertains from the following description thereof.

Technical Solution

In accordance with an aspect of the present disclosure, the above and other objects can be accomplished by the provision of a copper foil including a copper layer and an anticorrosive film disposed on the copper layer, wherein the copper foil has a Young's modulus of 3800 to 4600 kgf/mm$^2$ and a modulus bias factor (MBF) of less than 0.12. Here, the modulus bias factor (MBF) is calculated using Equation 1 below.

$$MBF = (\text{maximum modulus value} - \text{minimum modulus value})/(\text{average modulus value}) \quad \text{[Equation 1]}$$

In Equation 1 above, in the case in which the Young's modulus of the copper foil is measured three times at three points on the copper foil in the lateral direction thereof, the Young's modulus at the point at which the average value thereof is the lowest is the minimum modulus value, the Young's modulus at the point at which the average value thereof is the highest is the maximum modulus value, and the overall average of the Young's modulus measured at the three points is the average modulus value.

The copper foil may have a degree of increase of standard stretching, which is a ratio of elongation after heat treatment at 200□ for 30 minutes to elongation before heat treatment, of 2.5 to 5.5.

The copper foil may have a yield strength of 21 to 63 kgf/mm$^2$ at a normal temperature of 23±3° C.

The copper foil may have a maximum height roughness (Rmax) of 0.8 μm to 3.5 μm.

The copper foil may have a (220) plane, and the texture coefficient (TC(220)) of the (220) plane may be 0.48 to 1.28.

The anticorrosive film may include at least one of chrome, a silane compound, or a nitrogen compound.

The copper foil may have a thickness of 4 μm to 30 μm.

In accordance with another aspect of the present disclosure, there is provided an electrode for secondary batteries, the electrode including the copper foil described above and an active-material layer disposed on the copper foil.

In accordance with another aspect of the present disclosure, there is provided a secondary battery including a cathode), an anode disposed so as to be opposite the cathode, an electrolyte disposed between the cathode and the anode for providing an environment in which lithium ions are movable therebetween, and a separator for electrically isolating the cathode and the anode from each other, wherein the anode includes the copper foil described above and an active-material layer disposed on the copper foil.

In accordance with another aspect of the present disclosure, there is provided a flexible copper clad laminate (FCCL) including a polymer film and the copper foil described above, the copper foil being disposed on the polymer film.

In accordance with a further aspect of the present disclosure, there is provided a method of manufacturing a copper foil, the method including electrically conducting an electrode plate and a rotary electrode drum, disposed in an electrolytic solution including copper ions in the state of being spaced apart from each other, with a current density of 40 to 80 A/dm$^2$ in order to form a copper layer, wherein the electrolytic solution includes 70 to 90 g/L of copper ions, 50 to 150 g/L of sulfuric acid, 0.05 g/L or less of carbon, 1.0 mg/L or less of chlorine (Cl), and 25 mg/L or less of molybdenum (Mo).

Variation in the current density in the rotary electrode drum in the lateral direction thereof may be 3% or less.

The electrolytic solution may have a flow rate of 41 to 45 m$^3$/hour.

The method may further include soaking the copper layer in an anticorrosive solution.

The anticorrosive solution may include chrome (Cr).

The general description of the present disclosure given above is provided merely to illustrate or describe the present disclosure, and does not limit the scope of rights of the present disclosure.

Advantageous Effects

A copper foil according to an embodiment of the present disclosure has excellent adhesive force. When the copper foil according to the embodiment of the present disclosure is used as a current collector of an electrode for secondary batteries, therefore, separation between the copper foil and an active material is prevented. In particular, even in the case in which an active material having a high expansion rate is used, separation between the copper foil and the active material is prevented. As a result, it is possible to manufacture a secondary battery having high efficiency and an excellent capacity retention rate.

DESCRIPTION OF DRAWINGS

The accompanying drawings are provided in order to help the understanding of the present disclosure and to constitute a portion of the present specification, and illustrate embodiments of the present disclosure and describe the principles of the present disclosure together with the detailed description of the present disclosure.

BEST MODE

Figure 1:
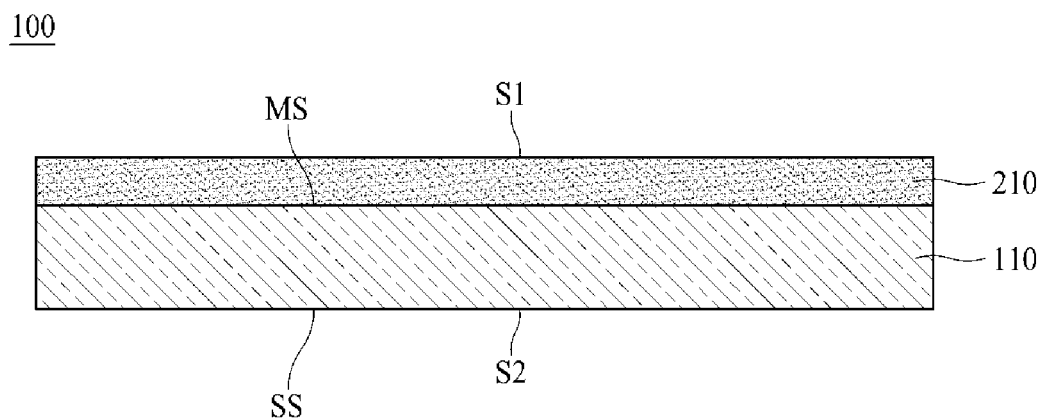
FIG. 1 is a schematic sectional view showing a copper foil according to an embodiment of the present disclosure.

Reference will now be made in detail to the preferred embodiments of the present disclosure, examples of which are illustrated in the accompanying drawings.

Those skilled in the art will appreciate that various modifications, additions and substitutions are possible without departing from the scope and spirit of the present disclosure as disclosed in the accompanying claims. Accordingly, the present disclosure encompasses the disclosure defined in the claims and modifications and alterations that fall within the scope of equivalents thereto.

The shapes, sizes, ratios, angles, and numbers disclosed in the drawings for describing embodiments of the present disclosure are merely examples, and thus the present disclosure is not limited to the illustrated details. Like reference numerals refer to like elements throughout the present specification.

In the case in which "comprise", "have", and "include" are used in the present specification, another part may also be present unless "only" is used. Terms in a singular form may include plural meanings unless noted to the contrary. Also, in construing an element, the element is to be construed as including an error range even if there is no explicit description thereof.

In describing a positional relationship, for example, when the positional relationship is described as "on", "above", "below", and "next", the case of no contact therebetween may be included, unless "just" or "directly" is used.

In describing a temporal relationship, for example, when the temporal order is described as "after", "subsequent", "next", and "before", the case which is not continuous may be included, unless "just" or "directly" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related to any one item.

Features of various embodiments of the present disclosure may be partially or completely coupled to or combined with each other, and may be variously inter-operated with each other and driven technically as will be easily understood by those skilled in the art. The embodiments of the present disclosure may be carried out independently from each other, or may be carried out together in an interrelated manner.

FIG. 1 is a schematic sectional view showing a copper foil 100 according to an embodiment of the present disclosure.

Referring to FIG. 1, the copper foil 100 includes a copper layer 110 and an anticorrosive film 210 disposed on the copper layer 110.

A copper layer 110 according to an embodiment of the present disclosure has a matte surface MS and a shiny surface SS, which is opposite the matte surface MS.

Figure 8:
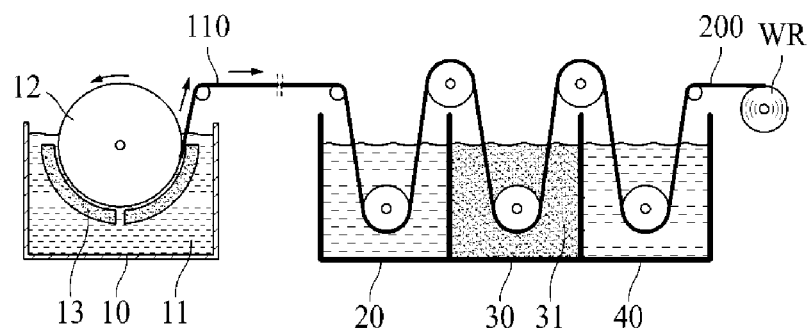
FIG. 8 is a schematic view showing a process of manufacturing the copper foil shown in FIG. 3.

The copper layer 110 may be formed on a rotary electrode drum, for example, by electroplating (see FIG. 8). Here, the shiny surface SS refers to a surface that contacts the rotary electrode drum during an electroplating process, and the matte surface MS refers to a surface that is opposite the shiny surface SS.

In general, the shiny surface SS has lower surface roughness Rz than the matte surface MS. However, the embodiment of the present disclosure is not limited thereto. The surface roughness Rz of the shiny surface SS may be the same as or higher than the surface roughness Rz of the matte surface MS.

The anticorrosive film 210 may be disposed on at least one of the matte surface MS or the shiny surface SS. Referring to FIG. 1, the anticorrosive film 210 is disposed on the matte surface MS. However, the embodiment of the present disclosure is not limited thereto. The anticorrosive film 210 may be disposed only on the shiny surface SS, or may be disposed both on the matte surface MS and on the shiny surface SS.

The anticorrosive film 210 may protect the copper layer 110 in order to prevent the copper layer 110 from being oxidized or deteriorated during a storage process. Consequently, the anticorrosive film 210 may also be referred to as a protective layer.

In an embodiment of the present disclosure, the anticorrosive film 210 may include at least one of chrome (Cr), a silane compound, or a nitrogen compound.

For example, the anticorrosive film 210 may be manufactured using an anticorrosive solution including chrome (Cr), i.e. an anticorrosive solution including a chromate compound.

In an embodiment of the present disclosure, the copper foil 100 has a first surface S1, which is the surface that is adjacent to the matte surface MS of the copper layer 110, and a second surface S2, which is the surface that corresponds to the shiny surface SS of the copper layer 110. Referring to FIG. 1, the first surface S1 of the copper foil 100 is the surface of the anticorrosive film 210.

In an embodiment of the present disclosure, the copper foil 100 has a Young's modulus of 3800 to 4600 kgf/mm².

The Young's modulus may also be referred to as a Young modulus. Specifically, the Young's modulus is a modulus indicating a change in the length of a certain material relative to stress applied thereto, and may also be referred to as an elastic modulus. For example, the Young's modulus may be expressed as the tensile strength of a sample relative to the tensile length of the sample until the sample breaks during a tensile test of the sample or as the gradient of a tensile strength—stretching curve to a stretched point.

In an embodiment of the present disclosure, the Young's modulus is measured using a universal testing machine (UTM) according to a method prescribed in the IPC-TM-650 Test Method Manual. At this time, the width of a sample for measuring the Young's modulus is 12.7 mm, the distance between grips is 50 mm, and the measurement speed is 50 mm/min.

If the Young's modulus is less than 3800 kgf/mm², in the case in which the copper foil 100 is used as an anode current collector of a secondary battery, the copper foil 100 may be deformed by the force applied to the copper foil 100 when the volume of an active material expands and contracts in a process of charging and discharging the secondary battery, whereby the active material, which is coated on the surface of the copper foil 100, may be separated from the copper foil 100. As a result, the capacity of the secondary battery may be reduced.

If the Young's modulus is greater than 4600 kgf/mm², the copper foil 100 may not sufficiently expand and contract in response to the expansion and contraction in the volume of the active material when the volume of the active material expands and contracts in the process of charging and discharging the secondary battery, whereby the copper foil 100 may tear. As a result, the capacity of the secondary battery may be reduced.

In an embodiment of the present disclosure, the Young's modulus of the copper foil 100 is adjusted to a range of 3800 to 4600 kgf/mm² such that the copper foil 100 expands and contracts in response to the expansion and contraction in the volume of the active material but is prevented from being deformed or tearing when the copper foil 100 is used as the anode current collector of the secondary battery, in consideration of the above.

In an embodiment of the present disclosure, the copper foil 100 has a modulus bias factor (MBF) of less than 0.12. The modulus bias factor (MBF) may be calculated using Equation 1 below.

$$MBF = (\text{maximum modulus value} - \text{minimum modulus value})/(\text{average modulus value}) \quad \text{[Equation 1]}$$

Here, the maximum modulus value, the minimum modulus value, and the average modulus value may be calculated as follows. Specifically, the Young's modulus of the copper foil 100 is measured three times at three points on the copper foil 100 in the lateral direction thereof. The Young's modulus at the point at which the average value thereof is the lowest is taken as the minimum modulus value, and the Young's modulus at the point at which the average value thereof is the highest is taken as the maximum modulus value. In addition, the overall average of the Young's modulus measured at the three points is taken as the average modulus value.

In the case in which the modulus bias factor (MBF) is greater than 0.12, the difference between strain at respective parts of the copper foil 100 becomes great due to the local modulus difference in the copper foil 100, whereby the active material may be separated from the copper foil 100 at the part thereof at which the modulus difference is great. Particularly, in the case in which the modulus bias factor (MBF) is greater than 0.12 even though the Young's modulus of the copper foil 100 is within a range of 3800 to 4600 kgf/mm², the active material may be separated from the copper foil 100 due to the modulus difference between respective positions of the copper foil. As a result, the capacity of the secondary battery is abruptly reduced.

In an embodiment of the present disclosure, the copper foil 100 has a degree of increase of standard stretching of 2.5 to 5.5. The degree of increase of standard stretching is a ratio of elongation after heat treatment at 200° C. for 30 minutes to elongation before heat treatment. More specifically, the degree of increase of standard stretching may be calculated using Equation 2 below.

$$\text{Degree of increase of standard stretching} = (\text{elongation after heat treatment})/(\text{elongation before heat treatment}) \quad \text{[Equation 2]}$$

Here, the elongation before heat treatment is the elongation of the copper foil 100 measured at a normal temperature (23° C.±3° C.) before heat treatment, and the elongation after heat treatment is the elongation of the copper foil 100 measured after heat treatment at 200° C. for 30 minutes. At this time, each of the elongation before heat treatment and the elongation after heat treatment is the average elongation value obtained after three measurements.

The elongation, yield strength, and Young's modulus may be measured using a universal testing machine (UTM) according to prescriptions defined in the IPC-TM-650 Test Method Manual. In an embodiment of the present disclosure, equipment from Instron Company may be used. At this time, the width of a sample for measuring elongation is 12.7 mm, the distance between grips is 50 mm, and the measurement speed is 50 mm/min.

If the degree of increase of standard stretching of the copper foil 100 is less than 2.5, in the case in which the copper foil 100 is used as an anode current collector of a secondary battery, the copper foil 100 may not expand and contract in response to expansion and contraction in the volume of an active material when the volume of the active material expands and contracts in a process of charging and discharging the secondary battery, whereby the copper foil 100 may tear. As a result, the capacity of the secondary battery is reduced.

If the degree of increase of standard stretching of the copper foil 100 is greater than 5.5, the copper foil 100 may be deformed by the force applied to the copper foil 100 when the volume of the active material expands and contracts in the process of charging and discharging the secondary battery, whereby the active material, which is coated on the surface of the copper foil 100, may be separated from the copper foil 100. As a result, the capacity of the secondary battery is reduced.

In an embodiment of the present disclosure, the copper foil 100 may have a yield strength of 21 to 63 kgf/mm² at a normal temperature of 23±3° C. The yield strength is measured using a universal testing machine (UTM) according to a method prescribed in the IPC-TM-650 Test Method Manual. The width of a sample for measuring the yield strength is 12.7 mm, the distance between grips is 50 mm, and the measurement speed is 50 mm/min.

If the yield strength of the copper foil 100 is less than 21 kgf/mm², the copper foil 100 may wrinkle or tear due to the force applied to the copper foil 100 in the process of manufacturing the copper foil 100. In addition, the copper foil 100 may wrinkle or tear in a process of manufacturing an electrode for secondary batteries using the copper foil 100 or in a process of manufacturing a secondary battery using the copper foil 100.

If the yield strength of the copper foil 100 is greater than 63 kgf/mm², on the other hand, workability may be reduced in the process of manufacturing the electrode for secondary batteries or the secondary battery using the copper foil 100.

In an embodiment of the present disclosure, the copper foil 100 has a maximum height roughness Rmax of 0.8 μm to 3.5 μm. Here, the maximum height roughness Rmax of the copper foil 100 is the maximum height roughness Rmax of the surfaces S1 and S2 of the copper foil 100. That is, each of the first surface S1 and the second surface S2 of the copper foil 100 may have a maximum height roughness Rmax of 0.8 μm to 3.5 μm.

The maximum height roughness Rmax may be measured using an illuminometer according to JIS B 0601-2001 standards. Specifically, in an embodiment of the present disclosure, the maximum height roughness Rmax may be measured using an SJ-310 model from Mitutoyo.

Specifically, a length for measurement excluding a cutoff length is set to 4 mm, the cutoff length is set to 0.8 mm at the initial stage and the last stage thereof, the radius of a stylus tip is set to 2 μm, and the measurement pressure is set to 0.75 mN. In the case in which measurement is performed after the above setting, it is possible to obtain a value of Rmax that corresponds to the maximum height roughness Rmax based on the measurement value measured using the Mitutoyo illuminometer.

If the maximum height roughness Rmax of the copper foil 100 is less than 0.8 μm, in the case in which the copper foil 100 is used as an anode current collector of an electrode for secondary batteries, the area of contact between the copper foil 100 and an active material is small, whereby it is not possible to secure sufficient force of adhesion between the copper foil 100 and the active material. As a result, the active material may be separated from the copper foil at the time of charging and discharging a secondary battery.

If the maximum height roughness Rmax of the copper foil 100 is greater than 3.5 μm, on the other hand, the surface of the copper foil 100 is nonuniform, whereby the active material is not uniformly adhered to the copper foil when the copper foil 100 is used as the current collector of the electrode for secondary batteries. As a result, the force of adhesion between the copper foil 100 and the active material may be reduced.

In an embodiment of the present disclosure, the copper foil 100 has a (220) plane, and the texture coefficient TC(220) of the (220) plane is 0.48 to 1.28. The texture coefficient TC(220) of the (220) plane is related to the crystalline structure of the surface of the copper foil 100.

Hereinafter, a method of measuring and calculating the texture coefficient TC(220) of the (220) plane of the copper foil 100 according to an embodiment of the present disclosure will be described with reference to FIG. 2.

Figure 2:
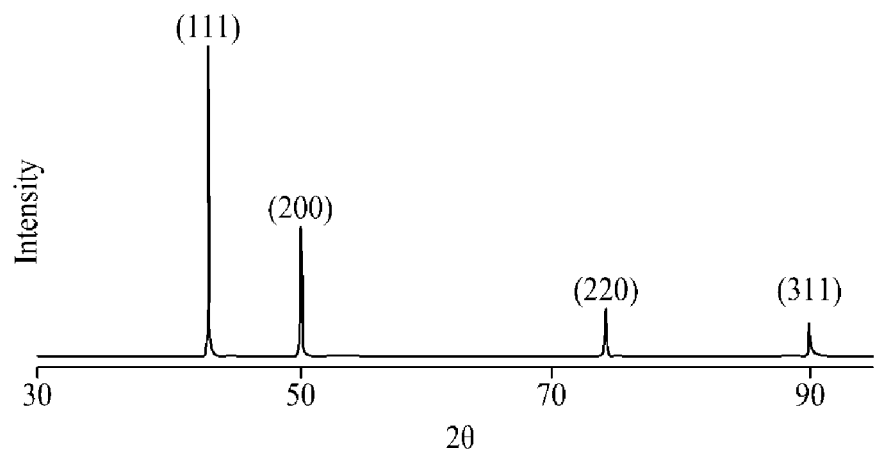
FIG. 2 is a view showing an illustration of an XRD graph of the copper foil.

FIG. 2 is a view showing an illustration of an XRD graph of the copper foil.

First, an XRD graph having peaks corresponding to n crystal planes is obtained using an X-ray diffraction method (XRD) (target: copper K alpha 1, 2θ interval: 0.01°, and 2θ scan speed: 3°/min) within a range of angle of diffraction 2θ of 30° to 95°. For example, as illustrated in FIG. 2, it is possible to obtain an XRD graph having peaks corresponding to a (111) plane, a (200) plane, a (220) plane, and a (311) plane.

Next, the XRD diffraction strength I(hkl) of each crystal plane hkl is calculated from the above graph. In addition, the XRD diffraction strength $I_0(hkl)$ of each of n crystal planes of standard copper powder prescribed by the Joint Committee on Powder Diffraction Standards (JCPDS) is calculated. Subsequently, the arithmetic mean value of $I(hkl)/I_0(hkl)$ of the n crystal planes is calculated, and $I(220)/I_0(220)$ of the (220) plane is divided by the arithmetic mean value, whereby the texture coefficient TC(220) of the (220) plane is calculated. That is, the texture coefficient TC(220) of the (220) plane is calculated based on Equation 3 below.

$$TC(220) = \frac{\frac{I(220)}{I_0(220)}}{\frac{1}{n}\sum \frac{I(hkl)}{I_0(hkl)}} \qquad \text{[Equation 3]}$$

In an embodiment of the present disclosure, the texture coefficient TC(220) of the (220) plane of each of the first and second surfaces S1 and S2 of the copper foil 100 is 0.48 to 1.28. The higher the texture coefficient TC(220), the denser the crystalline structure of the copper foil 100.

If the texture coefficient TC(220) of the (220) plane of the copper foil 100 is less than 0.48, the crystal texture of the copper foil 100 is not dense, whereby the texture of the copper foil 100 is easily deformed when the copper foil 100 is wound in a roll-to-roll (RTR) process, and therefore the copper foil may easily crumple. If the texture coefficient TC(220) of the (220) plane of the copper foil 100 is greater than 1.28, on the other hand, the texture of the copper foil 100 is excessively dense, whereby the brittleness of the copper foil is increased. As a result, the copper foil 100 tears in a process of manufacturing the copper foil, whereby the stability of a product is reduced.

In an embodiment of the present disclosure, the copper foil 100 may have a thickness of 4 μm to 30 μm. If the thickness of the copper foil 100 is less than 4 μm, workability is reduced in a process of manufacturing an electrode for secondary batteries using the copper foil 100 or in a process of manufacturing a secondary battery using the copper foil 100. If the thickness of the copper foil 100 is greater than 30 μm, the thickness of the electrode for secondary batteries using the copper foil 100 may be increased, and it may be difficult to realize a high-capacity secondary battery due to the increased thickness of the electrode.

Figure 3:
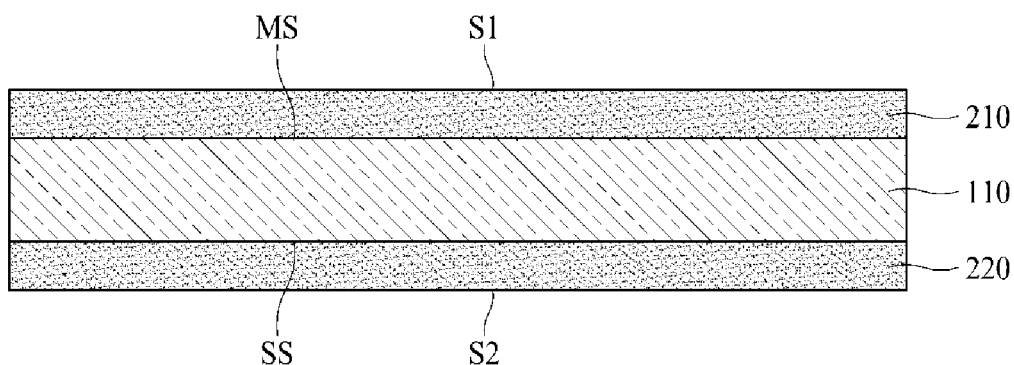
FIG. 3 is a schematic sectional view showing a copper foil according to another embodiment of the present disclosure.

FIG. 3 is a schematic sectional view showing a copper foil 200 according to another embodiment of the present disclosure. Hereinafter, a description of the components that have already been described will be omitted in order to avoid a duplicate description thereof.

Referring to FIG. 3, the copper foil 200 according to the embodiment of the present disclosure includes a copper layer 110 and two anticorrosive films 210 and 220 disposed respectively on a matte surface MS and a shiny surface SS of the copper layer 110. Compared to the copper foil 100 shown in FIG. 1, the copper foil 200 shown in FIG. 3 further includes the anticorrosive film 220, which is disposed on the shiny surface SS of the copper layer 110.

For the convenience of description, the anticorrosive film 210, which is one of the two anticorrosive films 210 and 220 and is disposed on the matte surface MS of the copper layer 110, may also be referred to as a first protective layer, and the anticorrosive film 220, which is disposed on the shiny surface SS of the copper layer 110, may also be referred to as a second protective layer.

In addition, the copper foil 200 shown in FIG. 3 has a first surface S1, which is the surface that is adjacent to the matte surface MS of the copper layer 110, and a second surface S2, which is the surface that is adjacent to the shiny surface SS of the copper layer 110. Here, the first surface S1 of the copper foil 200 is the surface of the anticorrosive film 210, which is disposed on the matte surface MS, and the second surface S2 of the copper foil 200 is the surface of the anticorrosive film 220, which is disposed on the shiny surface SS.

In another embodiment of the present disclosure, each of the two anticorrosive films 210 and 220 may include at least one of chrome (Cr), a silane compound, or a nitrogen compound.

In another embodiment of the present disclosure, the copper foil 200 has a Young's modulus of 3800 to 4600 kgf/mm$^2$.

In addition, the copper foil 200 has a modulus bias factor (MBF) of less than 0.12 and has a degree of increase of standard stretching of 2.5 to 5.5.

In another embodiment of the present disclosure, the copper foil 200 may have a yield strength of 21 to 63 kgf/mm$^2$ at a normal temperature of 23±3° C.

In addition, the copper foil 200 has a maximum height roughness Rmax of 0.8 μm to 3.5 μm.

In another embodiment of the present disclosure, the copper foil 200 has a (220) plane, and the texture coefficient TC(220) of the (220) plane is 0.48 to 1.28. Specifically, the texture coefficient TC(220) of the (220) plane of each of the first and second surfaces S1 and S2 of the copper foil 200 is 0.48 to 1.28.

In another embodiment of the present disclosure, the copper foil 200 has a thickness of 4 μm to 30 μm.

Figure 4:
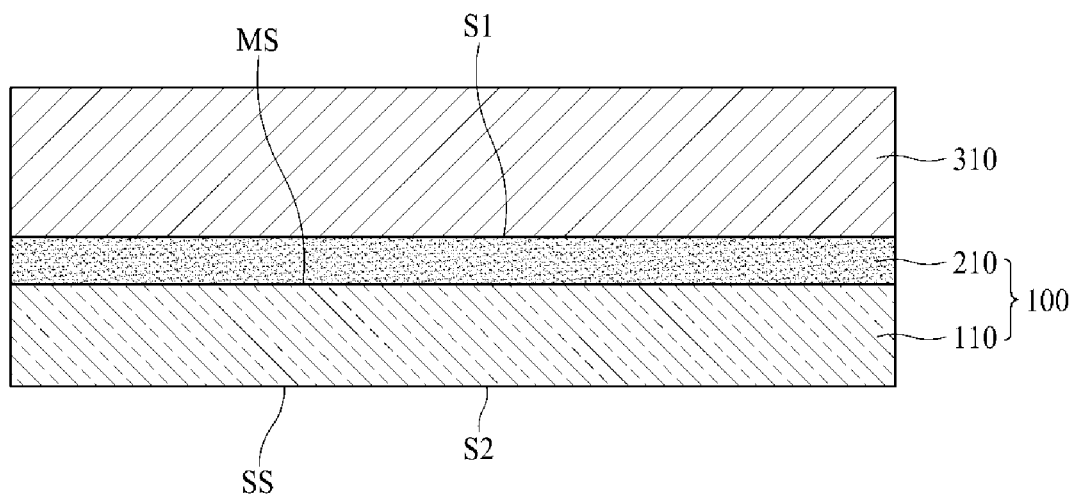
FIG. 4 is a schematic sectional view showing an electrode for secondary batteries according to another embodiment of the present disclosure.

FIG. 4 is a schematic sectional view showing an electrode 300 for secondary batteries according to another embodiment of the present disclosure.

Figure 6:
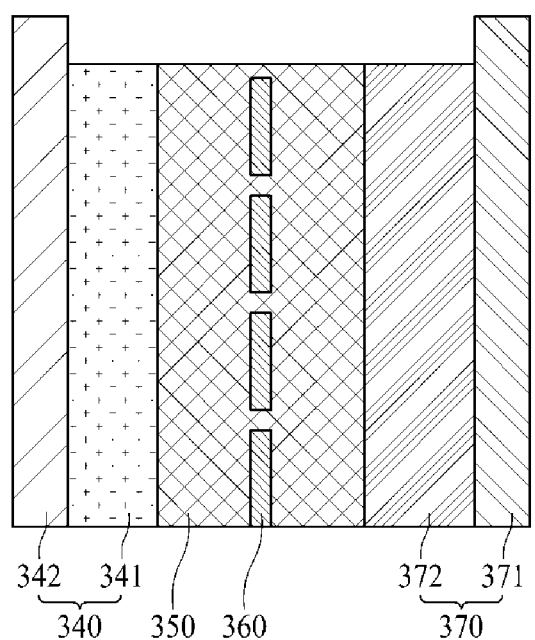
FIG. 6 is a schematic sectional view showing a secondary battery according to another embodiment of the present disclosure.

The electrode 300 for secondary batteries shown in FIG. 4 may be applied to, for example, the secondary battery 500 shown in FIG. 6.

Referring to FIG. 4, the electrode 300 for secondary batteries according to the embodiment of the present disclosure includes a copper foil 100 and an active-material layer 310 disposed on the copper foil 100. Here, the copper foil 100 is used as a current collector.

Specifically, the copper foil 100 has a first surface S1 and a second surface S2. The active-material layer 310 is disposed on at least one of the first surface S1 or the second surface S2 of the copper foil 100. For example, the active-material layer 310 may be disposed on an anticorrosive film 210.

An example in which the copper foil 100 of FIG. 1 is used as the current collector is shown in FIG. 4. However, the embodiment of the present disclosure is not limited thereto. The copper foil 200 shown in FIG. 3 may be used as the current collector of the electrode 300 for secondary batteries.

In addition, the structure in which the active-material layer 310 is disposed only on the first surface S1 of the copper foil 100 is shown in FIG. 4. However, the embodiment of the present disclosure is not limited thereto. The active-material layer 310 may be disposed on each of the first surface S1 and the second surface S2 of the copper foil 100. In addition, the active-material layer 310 may be disposed only on the second surface S2 of the copper foil 100.

The active-material layer 310 shown in FIG. 4 is made of an electrode active material, in particular a anode active material. That is, the electrode 300 for secondary batteries shown in FIG. 4 may be used as a anode.

The active-material layer 310 may include at least one of carbon, a metal, a metal oxide, or a composite of a metal and carbon. At least one of Ge, Sn, Li, Zn, Mg, Cd, Ce, Ni, or Fe may be used as the metal. In addition, the active-material layer 310 may include silicon (Si) in order to increase the charge and discharge capacity of the secondary battery.

As the secondary battery is repeatedly charged and discharged, the active-material layer 310 alternately contracts and expands. As a result, the active-material layer 310 becomes separated from the copper foil 100, whereby the charge and discharge efficiencies of the secondary battery are reduced. Particularly, in the case in which the active-material layer 310 includes silicon (Si), the degree of expansion and contraction of the active-material layer 310 is increased.

In another embodiment of the present disclosure, the copper foil 100, which is used as the current collector, is capable of contracting and expanding in response to the expansion and contraction of the active-material layer 310. Even in the case in which the active-material layer 310 contracts and expands, therefore, the copper foil 100 is prevented from being deformed or tearing. As a result, no separation between the copper foil 100 and the active-material layer 310 occurs. Consequently, a secondary battery including the electrode 300 for secondary batteries has excellent charge and discharge efficiencies and an excellent capacity retention rate.

Figure 5:
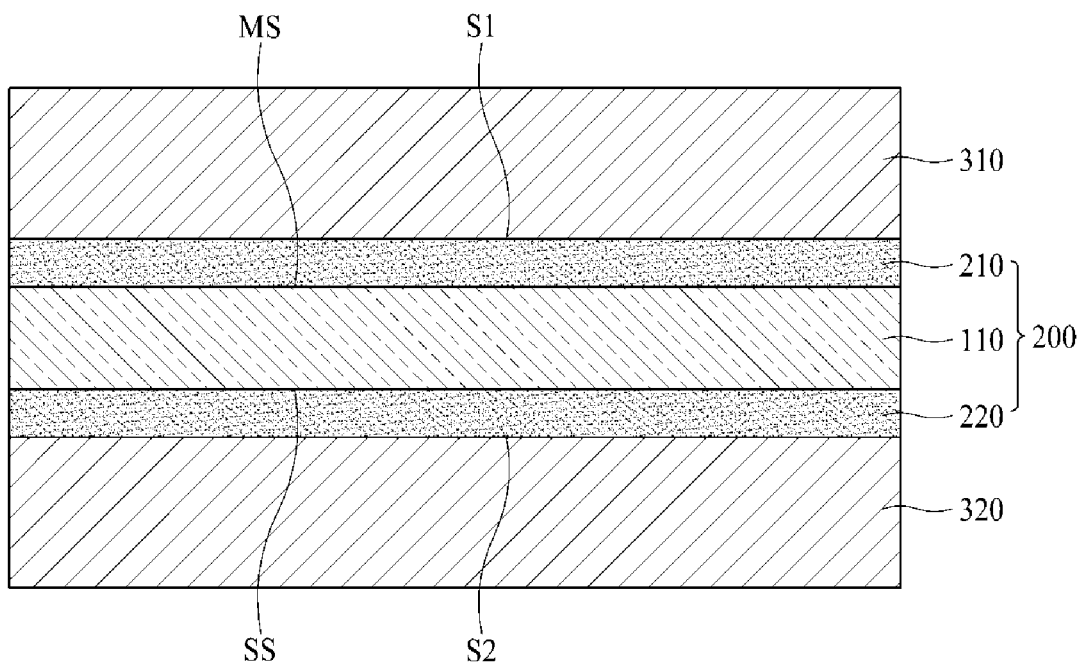
FIG. 5 is a schematic sectional view showing an electrode for secondary batteries according to another embodiment of the present disclosure.

FIG. 5 is a schematic sectional view showing an electrode 400 for secondary batteries according to another embodiment of the present disclosure.

The electrode 400 for secondary batteries according to the embodiment of the present disclosure includes a copper foil 200 and active-material layers 310 and 320 disposed on the copper foil 200. The copper foil 200 includes a copper layer 110 and anticorrosive films 210 and 220, which are disposed on opposite surfaces of the copper layer 110.

Specifically, the electrode 400 for secondary batteries shown in FIG. 5 includes the two active-material layers 310 and 320, which are disposed respectively on a first surface S1 and a second surface S2 of the copper foil 200. Here, the active-material layer 310, which is disposed on the first surface S1 of the copper foil 200, may also be referred to as a first active-material layer, and the active-material layer 320, which is disposed on the second surface S2 of the copper foil 200, may also be referred to as a second active-material layer.

The two active-material layers 310 and 320 may be made of the same material using the same method, or may be made of different materials using different methods.

FIG. 6 is a schematic sectional view showing a secondary battery 500 according to another embodiment of the present disclosure. The secondary battery 500 shown in FIG. 6 is, for example, a lithium secondary battery.

Referring to FIG. 6, the secondary battery 500 includes a cathode 370, an anode 340 disposed so as to be opposite the cathode 370, an electrolyte 350 for providing an environment in which ions are movable between the cathode 370 and the anode 340, and a separator 360 for electrically isolating the cathode 370 and the anode 340 from each other. Here, the ions that move between the cathode 370 and the anode 340 are lithium ions. The separator 360 separates the cathode 370 and the anode 340 from each other in order to prevent an electric charge generated in one electrode from moving to the other electrode through the interior of the secondary battery 500 to thus prevent useless consumption of the electric charge. Referring to FIG. 6, the separator 360 is disposed in the electrolyte 350.

The cathode 370 includes a cathode current collector 371 and a cathode active-material layer 372. An aluminum foil may be used as the cathode current collector 371.

The anode 340 includes an anode current collector 342 and an active-material layer 341. The active-material layer 341 of the anode 340 includes an anode active material.

The copper foil 100 shown in FIG. 1 or the copper foil 200 shown in FIG. 3 may be used as the anode current collector 342. In addition, the electrode 300 for secondary batteries shown in FIG. 4 or the electrode 400 for secondary batteries shown in FIG. 5 may be used as the anode 340 of the secondary battery 500 shown in FIG. 6.

Figure 7:
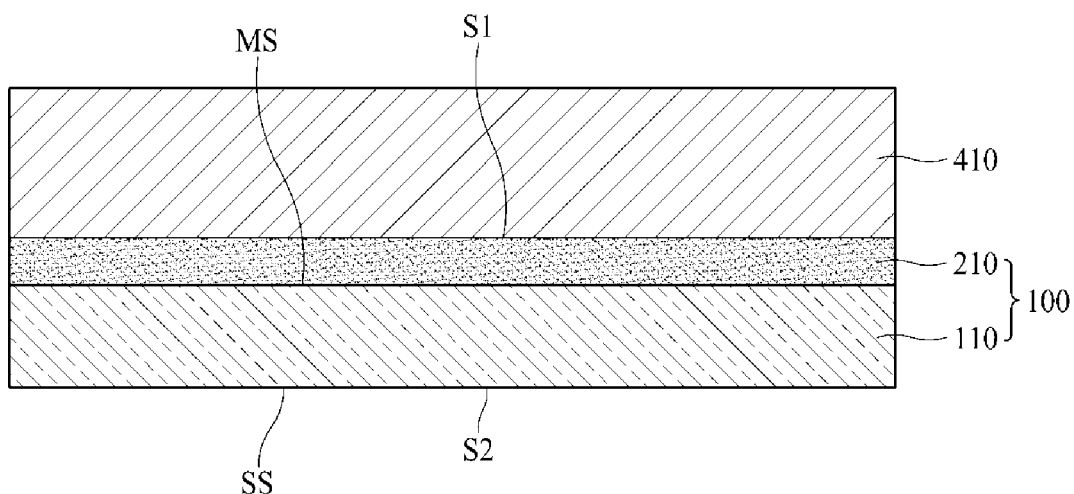
FIG. 7 is a sectional view showing a flexible copper clad laminate (FCCL) according to another embodiment of the present disclosure.

FIG. 7 is a schematic sectional view showing a flexible copper clad laminate 600 according to another embodiment of the present disclosure.

The flexible copper clad laminate 600 according to the embodiment of the present disclosure includes a polymer film 410 and a copper foil 100 disposed on the polymer film 410. The flexible copper clad laminate 600 including the copper foil 100 shown in FIG. 1 is shown in FIG. 7; however, the embodiment of the present disclosure is not limited thereto. For example, the copper foil 200 shown in FIG. 3 or another copper foil may be used in the flexible copper clad laminate 600 according to the embodiment of the present disclosure.

The polymer film 410 exhibits flexibility and nonconductivity. The kind of the polymer film 410 is not particularly restricted. For example, the polymer film 410 may include polyimide.

For example, a polyimide film and the copper foil 100 may be laminated by roll pressing, whereby the flexible copper clad laminate 600 may be manufactured. Alternatively, a polyimide precursor solution may be coated on the copper foil 100 and may then be thermally treated, whereby the flexible copper clad laminate 600 may be manufactured.

The copper foil 100 includes a copper layer 110, having a matte surface MS and a shiny surface SS, and an anticorrosive film 210, disposed on at least one of the matte surface MS or the shiny surface SS of the copper layer 110. Here, the anticorrosive film 210 may be omitted.

Referring to FIG. 7, an example in which the polymer film 410 is disposed on the anticorrosive film 210 is shown; however, the embodiment of the present disclosure is not limited thereto. The polymer film 410 may be disposed on the shiny surface SS of the copper layer 110.

Hereinafter, a method of manufacturing a copper foil 200 according to a further embodiment of the present disclosure will be described in detail with reference to FIG. 8.

FIG. 8 is a schematic view showing a method of manufacturing the copper foil 200 shown in FIG. 3.

First, an electrode plate 13 and a rotary electrode drum 12, which are disposed in an electrolytic solution 11 including copper ions in the state of being spaced apart from each other, are electrically conducted with a current density of 40 to 80 ASD (A/dm$^2$) in order to form a copper layer 110. The distance between the electrode plate 13 and the rotary electrode drum 12 may be adjusted to fall within the range of 8 to 13 mm.

The higher the density of the current supplied between the electrode plate 13 and the rotary electrode drum 12, the greater the uniformity of plating that may be achieved.

If the density of the current supplied between the electrode plate 13 and the rotary electrode drum 12 is less than 40 ASD, the surface roughness of the copper layer 1 is increased due to the generation of crystal grains. As a result, the maximum height roughness Rmax of the copper foil 200 may exceed 3.5 µm, and the Young's modulus of the copper foil 200 may be reduced below 3800 kgf/mm$^2$.

If the density of the current supplied between the electrode plate 13 and the rotary electrode drum 12 is greater than 80 ASD, on the other hand, the micro-scale reduction of crystal grains may be accelerated. Consequently, the surface roughness of the copper layer 110 may be reduced, whereby the maximum height roughness Rmax of the copper foil 200 may become less than 0.8 µm. As a result, the force of adhesion between the copper layer 110 and the active-material layer may be reduced.

The surface roughness of the shiny surface SS of the copper layer 110 may vary depending on the degree of grinding of the surface of the rotary electrode drum 12. In order to adjust the surface roughness of the shiny surface SS, the surface of the rotary electrode drum 12 may be ground, for example, using a grinding brush having a grit of #800 to #3000.

In an embodiment of the present disclosure, variation in the density of current in the rotary electrode drum 12 in the lateral direction thereof is set to 3% or less. In the case in which the variation in the density of current measured in the rotary electrode drum 12 in the lateral direction thereof is high, nonuniform electroplating may be performed, whereby the copper layer 110 may be nonuniform. In the case in which the copper layer 110 is nonuniform, the modulus bias factor (MBF) of the copper layer is increased. For example, in the case in which variation in the density of current in the rotary electrode drum 12 in the lateral direction thereof is greater than 3%, the modulus bias factor (MBF) of the copper layer 110 may exceed 0.12.

In the process of forming the copper layer 110, the temperature of the electrolytic solution 11 is maintained between 40 and 65° C.

The density of current or the composition of the electrolytic solution 11 may be adjusted in order to control the surface roughness of the matte surface MS of the copper layer 110.

In an embodiment of the present disclosure, the electrolytic solution 11 includes 70 to 90 g/L of copper ions and 50 to 150 g/L of sulfuric acid. In addition, the electrolytic solution 11 may include an organic additive. For example, at least one selected from among hydroxyethyl cellulose (HEC), an organic sulfide, an organic nitride, and thiourea may be used as the organic additive.

The electrolytic solution 11 includes 0.05 g/L or less of carbon. Specifically, the total amount of carbon TC in the electrolytic solution 11 is 0.05 g/L or less. In the case in which the total amount of carbon TC in the electrolytic solution 11 exceeds 0.05 g/L, a eutectoid may be formed in the copper layer 110 due to the presence of carbon. In the case in which two phases exist in the copper layer 110 due to the eutectoid, the Young's modulus of the copper layer 110 is reduced.

The electrolytic solution 11 includes 1.0 mg/L or less of chlorine (Cl). Here, the chlorine (Cl) includes both chloride ions (Cl⁻) and chlorine atoms present in chlorine molecules.

The chlorine (Cl) may be used to remove silver (Ag) ions introduced into the electrolytic solution 11, for example, when electroplating is performed.

Specifically, the chlorine (Cl) may precipitate the silver (Ag) ions in the form of silver chloride (AgCl). The silver chloride (AgCl) may be removed by filtering.

In the case in which the content of the chlorine (Cl) in the electrolytic solution 11 exceeds 1.0 mg/L, the recombination of the plated texture is accelerated at the time of heat treatment, whereby the degree of increase of standard stretching of the copper foil 200 may exceed 5.5.

The electrolytic solution 11 includes 25 mg/L or less of molybdenum (Mo). Here, the molybdenum (Mo) includes both molybdenum (Mo) ions and molybdenum (Mo) atoms existing in molybdenum molecules. In the case in which the content of the molybdenum (Mo) exceeds 25 mg/L, the production of a molybdenum-copper alloy may be accelerated, whereby the degree of increase of stretching of the copper layer 110 may be reduced below 2.5.

In order to reduce the content of impurities in the electrolytic solution 11, a copper wire, which is a material for copper ions, may be cleaned. More specifically, the copper wire may be thermally treated in an oxygen atmosphere at a temperature of 600 to 900° C. for 30 to 60 minutes in order to remove organic matter from the copper wire, and the thermally treated copper wire may be cleaned using a sulfuric acid solution having a concentration of 10%.

The electrolytic solution 11 may be circulated at a flow rate of 41 to 45 m³/hour.

Specifically, in order to remove solid impurities from the electrolytic solution 11 while electroplating is performed, the electrolytic solution 11 may be filtered at a flow rate of 41 to 45 m³/hour. In the case in which the flow rate of the electrolytic solution is less than 41 m³/hour, the flow speed of the electrolytic solution may be low and thus overvoltage is generated, whereby the copper layer 110 may be nonuniformly formed. In the case in which the flow rate of the electrolytic solution is greater than 45 m³/hour, on the other hand, a filter may be damaged, whereby foreign matter may be introduced into the electrolytic solution 11.

Also, in order to remove carbon from the electrolytic solution 11 while electroplating is performed, the electrolytic solution 11 may be filtered using activated carbon. In order to maintain or improve the cleanliness of the electrolytic solution 11, the electrolytic solution 11 may be ozonized, or hydrogen peroxide and air may be introduced into the electrolytic solution 11.

Variation in the flow rate of the electrolytic solution 11 that is supplied to an electrolytic bath may be maintained at 5% or less or at 2% or less.

Subsequently, the copper layer 110 is cleaned in a cleaning bath 20.

For example, acid cleaning for removing impurities, such as a resin ingredient or a natural oxide, from the surface of the copper layer 110 and water cleaning for removing the acidic solution used for acid cleaning may be sequentially performed. The cleaning process may be omitted.

Subsequently, anticorrosive films 210 and 220 are formed on the copper layer 110.

Referring to FIG. 8, the copper layer 110 may be soaked in an anticorrosive solution 31 contained in an anticorrosion bath 30 in order to form the anticorrosive films 210 and 220 on the copper layer 110. The anticorrosive solution 31 may include chrome, and the chrome (Cr) may be present in the anticorrosive solution 31 in an ionic state.

The anticorrosive solution 31 may include 0.5 to g/L of chrome. In order to form the anticorrosive films 210 and 220, the temperature of the anticorrosive solution 31 may be maintained between 20 and 40° C. The anticorrosive films 210 and 220 thus formed may also be referred to as protective layers.

Meanwhile, each of the anticorrosive films 210 and 220 may include a silane compound formed by silane treatment, or may include a nitrogen compound formed by nitrogen treatment.

A copper foil 200 is manufactured as the result of forming the protective layers 210 and 220.

Subsequently, the copper foil 200 is cleaned in a cleaning bath 40. This cleaning process may be omitted.

Subsequently, a drying process is performed, and then the copper foil 200 is wound around a winder WR.

Hereinafter, the present disclosure will be described in detail with reference to manufacturing examples and comparative examples. However, the following manufacturing examples and comparative examples are provided only to help understanding of the present disclosure, and the scope of rights of the present disclosure is not limited by the manufacturing examples or the comparative examples.

Manufacturing Examples 1 to 6 and Comparative Examples 1 to 5

A copper foil was manufactured using a foil-manufacturing machine including an electrolytic bath 10, a rotary electrode drum 12 disposed in the electrolytic bath 10, and an electrode plate 13 disposed so as to be spaced apart from the rotary electrode drum 12. An electrolytic solution 11 was a copper sulfate solution, the concentration of copper ions in the electrolytic solution 11 was 75 g/L, the concentration of sulfuric acid in the electrolytic solution 11 was 100 g/L, and the temperature of the electrolytic solution 11 was maintained at 55° C.

The total amount of carbon TC, the content of chlorine (Cl), and the content of molybdenum (Mo) in the electrolytic solution 11 are as shown in Table 1 below.

Current having densities shown in Table 1 was supplied between the rotary electrode drum 12 and the electrode plate 13 in order to manufacture a copper layer 110. Variation in the density of current in the rotary electrode drum 12 in the lateral direction thereof is as shown in Table 1.

Subsequently, the copper layer 110 was cleaned using a cleaning bath 20.

Subsequently, the copper layer 110 was soaked in an anticorrosive solution 31 contained in an anticorrosion bath 30 in order to form anticorrosive films 210 and 220, each including chrome, on the surface of the copper layer 110. At this time, the temperature of the anticorrosive solution 31 was maintained at 30° C., and the anticorrosive solution 31 included 2.2 g/L of chrome (Cr). As a result, copper foils according to Manufacturing Examples 1 to 6 and Comparative Examples 1 to 5 were manufactured.

TABLE 1

| Classification | Density of current (ASD) | TC (g/L) | Content of chlorine (mg/L) | Content of Mo (mg/L) | Variation in density of current in lateral direction of electrode drum (%) |
| --- | --- | --- | --- | --- | --- |
| Manufacturing Example 1 | 60 | 0.023 | 0.5 | 13 | 1.5 |
| Manufacturing Example 2 | 40 | 0.023 | 0.5 | 13 | 1.5 |
| Manufacturing Example 3 | 60 | 0.048 | 0.5 | 13 | 1.5 |
| Manufacturing Example 4 | 60 | 0.023 | 0.5 | 13 | 2.9 |
| Manufacturing Example 5 | 60 | 0.023 | 0.5 | 24 | 1.5 |
| Manufacturing Example 6 | 60 | 0.023 | 0.9 | 13 | 1.5 |
| Comparative Example 1 | 35 | 0.023 | 0.5 | 13 | 1.5 |
| Comparative Example 2 | 60 | 0.052 | 0.5 | 13 | 1.5 |
| Comparative Example 3 | 60 | 0.023 | 0.5 | 13 | 3.2 |
| Comparative Example 4 | 60 | 0.023 | 0.5 | 27 | 1.5 |
| Comparative Example 5 | 60 | 0.023 | 1.1 | 13 | 1.5 |

(i) The Young's modulus, (ii) the modulus bias factor (MBF), (iii) the degree of increase of standard stretching, and (iv) the texture coefficient TC(220) of the (220) plane of each of the copper foils according to Manufacturing Examples 1 to 6 and Comparative Examples 1 to 5, manufactured as described above, were measured, and the results are shown in Table 2.

(i) Young's Modulus

The Young's modulus was measured using a universal testing machine (UTM) according to a method prescribed in the IPC-TM-650 Test Method Manual. The width of each sample for measuring the Young's modulus was 12.7 mm, the distance between grips was 50 mm, and the measurement speed was 50 mm/min.

(ii) Modulus Bias Factor (MBF)

The Young's modulus of each copper foil was measured three times at three points on the copper foil in the lateral direction thereof. The Young's modulus at the point at which the average value was the lowest was taken as the minimum modulus value, and the Young's modulus at the point at which the average value was the highest was taken as the maximum modulus value. In addition, the overall average of the Young's modulus measured at the three points was taken as the average modulus value. The modulus bias factor (MBF) was calculated using Equation 1 below with the maximum modulus value, the minimum modulus value, and the average modulus value MBF=(maximum modulus value−minimum modulus value)/(average modulus value) [Equation 1]

(iii) Degree of Increase of Standard Stretching

The elongation of each copper foil was measured three times at a normal temperature (23° C.±3° C.), and the average thereof was taken as elongation before heat treatment. Each copper foil was thermally treated at 200° C. for 30 minutes, the elongation of the thermally treated copper foil was measured three times, and the average thereof was taken as elongation after heat treatment.

The elongation was measured using a universal testing machine (UTM) according to a method prescribed in the IPC-TM-650 Test Method Manual. The width of each sample for measuring the elongation was 12.7 mm, the distance between grips was 50 mm, and the measurement speed was 50 mm/min.

The degree of increase of standard stretching was calculated using Equation 2 with the elongation before heat treatment and the elongation after heat treatment.

Degree of increase of standard stretching=(elongation after heat treatment)/(elongation before heat treatment) [Equation 2]

(iv) Texture Coefficient TC(220) of (220) Plane

An X-ray diffraction method (XRD) ((i) target: copper K alpha 1, (ii) 2θ interval: 0.01°, and (iii) 2θ scan speed: 3°/min) was performed within a range of angle of diffraction 2θ of 30° to 95° in order to obtain an XRD graph having peaks corresponding to n crystal planes, and the XRD diffraction strength I(hkl) of each crystal plane hkl was calculated from this graph. In addition, the XRD diffraction strength $I_0(hkl)$ of each of n crystal planes of standard copper powder prescribed by the Joint Committee on Powder Diffraction Standards (JCPDS) was calculated. Subsequently, the arithmetic mean value of $I(hkl)/I_0(hkl)$ of the n crystal planes was calculated, and $I(220)/I_0(220)$ of the (220) plane was divided by the calculated arithmetic mean value, whereby the texture coefficient TC(220) of the (220) plane of each copper foil was calculated. The texture coefficient TC(220) of the (220) plane was calculated based on Equation 3 below.

$$TC(220) = \frac{\frac{I(220)}{I_0(220)}}{\frac{1}{n}\sum \frac{I(hkl)}{I_0(hkl)}}$$ [Equation 3]

(v) Evaluation of Capacity Retention Rate

1) Manufacture of Anode 2 wt % of styrene-butadiene rubber (SBR) and 2 wt % of carboxymethyl cellulose (CMC) were mixed with 100 wt % of commercially available carbon for anode active materials in distilled water, as a solvent, in order to prepare a slurry for anode active materials. The slurry for anode active materials was applied to each of the copper foils according to Manufacturing Examples 1 to 6 and Comparative Examples 1 to 5, having a width of 10 cm, using a doctor blade such that the slurry had a thickness of 40 μm, was dried at 120° C., and was pressed at a pressure of 1 ton/d in order to manufacture a anode for secondary batteries.

2) Manufacture of Electrolytic Solution $LiPF_6$, as a solute, was dissolved in a non-aqueous organic solvent obtained by mixing ethylene carbonate (EC) and ethyl methyl carbonate (EMC) with each other at a ratio of 1:2 so as to have a concentration of 1M in order to manufacture a basic electrolytic solution. 99.5 wt % of the basic electrolytic solution and 0.5 wt % of succinic anhydride were mixed with each other in order to manufacture a non-aqueous electrolytic solution.

3) Manufacture of Cathode

A lithium manganese oxide, $Li_{1.1}Mn_{1.85}Al_{0.05}O_4$, and a lithium manganese oxide having an orthorhombic crystal structure, $o\text{-}LiMnO_2$, were mixed with each other at a ratio (weight ratio) of 90:10 in order to manufacture a cathode active material. The cathode active material, carbon black, and polyvinylidene fluoride (PVDF), as a binder, were mixed with each other in a ratio (weight ratio) of 85:10:5, and the same was mixed with NMP, as an organic solvent, in order to manufacture a slurry. The slurry thus manufactured was applied to opposite surfaces of an aluminum foil (Al foil) having a thickness of 20 μm and was then dried in order to manufacture a cathode.

4) Manufacture of a Lithium Secondary Battery for Tests

The cathode and the anode were disposed in an aluminum can so as to be isolated from the aluminum can, and the non-aqueous electrolytic solution and a separator were disposed therebetween in order to manufacture a coin-shaped lithium secondary battery. Polypropylene (Celgard 2325; thickness 25 μm, average pore size φ28 nm, and porosity 40%) was used as the separator.

5) Measurement of Capacity Retention Rate

The lithium secondary battery thus manufactured was operated at a charge voltage of 4.3 V and a discharge voltage of 3.4 V in order to measure the capacity per gram of the cathode. Subsequently, the lithium secondary battery was charged and discharged 500 times at a current rate (C-rate) of 0.5 C at a high temperature of 50° C. in order to calculate the capacity retention rate of the lithium secondary battery. In the case in which the capacity retention rate of the lithium secondary battery was 80% or less, the copper foil was determined to be inappropriate for use as an anode current collector of the lithium secondary battery.

The capacity retention rate may be calculated using Equation 4 below.

Capacity retention rate (%)=[(capacity after 500 charges and discharges)/(capacity after one charge and discharge)]×100    [Equation 4]

The test results are as shown in Table 2.

TABLE 2

| Classification | Young's modulus (kgf/mm²) | MBF | Degree of increase of standard stretching | Texture coefficient of (220) plane | Capacity retention rate (%) |
|---|---|---|---|---|---|
| Manufacturing Example 1 | 4218 | 0.06 | 4.1 | 0.88 | 88 |
| Manufacturing Example 2 | 3822 | 0.06 | 4.3 | 0.89 | 89 |
| Manufacturing Example 3 | 4587 | 0.06 | 3.9 | 0.86 | 91 |
| Manufacturing Example 4 | 4215 | 0.11 | 4.1 | 0.88 | 85 |
| Manufacturing Example 5 | 4223 | 0.06 | 2.6 | 1.22 | 87 |
| Manufacturing Example 6 | 4220 | 0.06 | 5.4 | 0.86 | 85 |
| Comparative Example 1 | 3775 | 0.06 | 4.3 | 0.88 | 77 |
| Comparative Example 2 | 4618 | 0.06 | 3.9 | 0.85 | 78 |
| Comparative Example 3 | 4215 | 0.13 | 4.1 | 0.87 | 75 |
| Comparative Example 4 | 4223 | 0.06 | 2.4 | 1.28 | 73 |
| Comparative Example 5 | 4220 | 0.06 | 5.6 | 0.89 | 78 |

Referring to Table 2, each of the lithium secondary batteries manufactured using the copper foils according to Comparative Examples 1 to 5 has a capacity retention rate such that each of the copper foils according to Comparative Examples 1 to 5 is evaluated to be inappropriate as an anode current collector of the lithium secondary battery.

Specifically, it can be seen that each of the lithium secondary batteries manufactured using the following copper foils does not have a sufficient capacity retention rate (a capacity retention rate of 80% or more):

(1) Comparative Example 1, in which the density of current in a process of forming the copper foil 110 is less than 40 ADS;

(2) Comparative Example 2, in which the total amount of carbon TC in the electrolytic solution exceeds 0.05 g/L;

(3) Comparative Example 5, in which the content of chlorine (Cl) in the electrolytic solution exceeds 1.0 mg/L;

(4) Comparative Example 4, in which the content of molybdenum (Mo) in the electrolytic solution exceeds 25 mg/L;

(5) Comparative Example 3, in which variation in the density of current in the electrode drum in the lateral direction thereof exceeds 3%;

(6) Comparative Example 1, in which the Young's modulus is less than 3800 kgf/mm², and Comparative Example 2, in which the Young's modulus is greater than 4600 kgf/mm²;

(7) Comparative Example 3, in which the modulus bias factor (MBF) exceeds 0.12; and (8) Comparative Example 4, in which the degree of increase of standard stretching is less than 2.5, and Comparative Example 5, in which the degree of increase of standard stretching is greater than 5.5.

In contrast, it is confirmed that each of the lithium secondary batteries manufactured using the copper foils according to Manufacturing Examples 1 to 6 manufactured under conditions according to the embodiments of the present disclosure has a capacity retention rate of more than 80%.

It will be apparent to those skilled in the art that the present disclosure described above is not limited by the above-described embodiments and the accompanying drawings and that various substitutions, modifications, and variations can be made in the present disclosure without departing from the spirit or scope of the disclosure. Consequently, the scope of the present disclosure is defined by the accompanying claims, and it is intended that all variations or modifications derived from the meaning, scope, and equivalent concept of the claims fall within the scope of the present disclosure.

DESCRIPTION OF REFERENCE SYMBOLS

100, 200: Copper foils
210, 220: Anticorrosive films
310: Active-material layer 300, 400: Electrodes for secondary batteries
MS: Matte surface
SS: Shiny surface

The invention claimed is:

1. A copper foil comprising:
a copper layer; and
an anticorrosive film disposed on the copper layer, wherein the copper foil has a Young's modulus of 3800 to 4600 kgf/mm$^2$, a modulus bias factor (MBF) of 0.06 to 0.11, and a degree of increase of standard stretching, which is a ratio of elongation after heat treatment at 200° C. for 30 minutes to elongation before heat treatment, of 2.6 to 5.4,
wherein the modulus bias factor (MBF) is calculated using Equation 1 below, MBF=(maximum modulus value−minimum modulus value)/(average modulus value)    [Equation 1]

where, in a case in which the Young's modulus of the copper foil is measured three times at three points on the copper foil in a lateral direction thereof, the Young's modulus at a point at which an average value thereof is the lowest is the minimum modulus value, the Young's modulus at a point at which the average value thereof is the highest is the maximum modulus value, and an overall average of the Young's modulus measured at the three points is the average modulus value, and,
wherein the copper foil has a (220) plane, and a texture coefficient (TC(220)) of the (220) plane is 0.48 to 1.28.

2. The copper foil according to claim 1, wherein the copper foil has a yield strength of 21 to 63 kgf/mm$^2$ at a normal temperature of 23±3° C.

3. The copper foil according to claim 1, wherein the copper foil has a maximum height roughness (Rmax) of 0.8 μm to 3.5 μm.

4. The copper foil according to claim 1, wherein the anticorrosive film comprises at least one of chrome, a silane compound, or a nitrogen compound.

5. The copper foil according to claim 1, wherein the copper foil has a thickness of 4 μm to 30 μm.

6. An electrode for secondary batteries, the electrode comprising:
the copper foil according to any one of claim 1; and
an active-material layer disposed on the copper foil.

7. A secondary battery comprising:
a cathode;
an anode disposed so as to be opposite the cathode;
an electrolyte disposed between the cathode and the anode for providing an environment in which lithium ions are movable therebetween; and
a separator for electrically isolating the cathode and the anode from each other, wherein
the anode comprises:
the copper foil according to any one of claim 1; and
an active-material layer disposed on the copper foil.

8. A flexible copper clad laminate comprising:
a polymer film; and
the copper foil according to any one of claim 1, the copper foil being disposed on the polymer film.

9. A method of manufacturing the copper foil of claim 1, the method comprising:
electrically conducting an electrode plate and a rotary electrode drum, disposed in an electrolytic solution comprising copper ions in a state of being spaced apart from each other, with a current density of 40 to 80 A/dm$^2$ in order to form a copper layer, wherein
the electrolytic solution comprises:
70 to 90 g/L of copper ions;
50 to 150 g/L of sulfuric acid;
0.05 g/L or less of carbon;
1.0 mg/L or less of chlorine (Cl); and
25 mg/L or less of molybdenum (Mo).

10. The method according to claim 9, wherein variation in the current density in the rotary electrode drum in a lateral direction thereof is 3% or less.

11. The method according to claim 9, wherein the electrolytic solution has a flow rate of 41 to 45 m$^3$/hour.

12. The method according to claim 9, further comprising soaking the copper layer in an anticorrosive solution.

13. The method according to claim 9, wherein the anticorrosive solution comprises chrome (Cr).

* * * * *